United States Patent [19]

Daly

[11] Patent Number: 5,187,446
[45] Date of Patent: Feb. 16, 1993

[54] FEEDBACK ISOLATION AMPLIFIER

[75] Inventor: James a. Daly, Chelsea, Mass.

[73] Assignee: Digital Equipment Corporation, Maynard, Mass.

[21] Appl. No.: 896,282

[22] Filed: Jun. 10, 1992

[51] Int. Cl.$^5$ .............................................. H03F 3/38
[52] U.S. Cl. ...................................... 330/10; 330/59; 330/165
[58] Field of Search .................... 330/10, 59, 165, 195, 330/207 A, 251, 308

[56] References Cited

U.S. PATENT DOCUMENTS

| | | | |
|---|---|---|---|
| 3,602,801 | 8/1971 | Williamson | 323/17 |
| 3,885,219 | 5/1975 | Vaughn | 330/165 X |
| 3,921,088 | 11/1975 | Feucht | 330/10 |
| 4,191,929 | 3/1980 | Max et al. | 330/10 |
| 4,337,438 | 6/1982 | Guggenbühl et al. | 330/10 |

FOREIGN PATENT DOCUMENTS 1290481  2/1987  U.S.S.R. ............................... 330/195

Primary Examiner—Steven Mottola
Attorney, Agent, or Firm—Ronald E. Myrick; Barry N. Young; Ronald C. Hudgens

[57] ABSTRACT

An isolation amplifier employs feedback to accurately amplify an input signal while maintaining electrical isolation between the input and output signals. The isolation amplifier consists of an amplitude modulator, an isolation transformer having a pair of matched secondary windings, a peak-detector output circuit, and a matching peak-detector feedback circuit. The isolation transformer couples an amplitude-modulated signal to both peak detector circuits while maintaining electrical isolation. The output from the feedback circuit is fed back to the amplitude modulator, so that the amplitude-modulated signal represents the difference between the input to the amplifier and the feedback signal.

11 Claims, 4 Drawing Sheets

5,187,446

FEEDBACK ISOLATION AMPLIFIER

FIELD OF THE INVENTION

The present invention relates to electronic amplifier circuits, and more particularly to amplifier circuits whose outputs are electrically isolated from their inputs.

BACKGROUND OF THE INVENTION

Isolation amplifiers are commonly employed to transfer a signal from one part of an electrical or electronic system to another part which is electrically isolated from the first part. An example of such a system is a high-voltage power supply containing batteries whose voltage must be monitored. In such systems, there is typically a battery voltage sensing circuit and a separate circuit to drive an operator display which displays the value of the battery voltage. As a safety precaution, the sensing circuit is electrically isolated from the display circuit, so that an operator is unlikely to contact hazardous voltages even if a fault should develop in the sensing circuit. An isolation amplifier enables the output of the sensing circuit to be transferred across an isolation barrier to the display circuit while maintaining the necessary electrical isolation.

Many systems employing isolation amplifiers have stringent requirements for accuracy. For example, in the monitoring system described above, it is important that the battery voltage is accurately measured and displayed. Therefore the isolation amplifier used in such a system must operate accurately.

The accuracy of any amplifier, including isolation amplifiers, is a critical parameter affecting its design, operation, and cost. Generally, achieving high accuracy requires the use of high-precision electronic components, which are more expensive than lower-precision components. To reduce the cost of electrical systems employing isolation amplifiers, it is desirable to build an inexpensive isolation amplifier with high accuracy.

SUMMARY OF THE INVENTION

The present invention is embodied in an isolation amplifier employing feedback in a unique fashion to achieve accuracy despite using inexpensive components. In such an amplifier, an input circuit creates a difference signal that indicates the amplitude difference between the amplifier input signal and a feedback signal. The difference signal is coupled by a coupling means, such as a transformer, across the isolation barrier to an output circuit, and also to a feedback circuit which is substantially identical to the output circuit. The feedback circuit creates the feedback signal from the copy of the difference signal that it receives at its input, and thus completes a feedback loop within the amplifier.

The coupling means couples the difference signal to the feedback circuit and the output circuit the same way, so that they receive essentially identical signals at their inputs. The output circuit generates the isolated output signal of the amplifier from its input signal; the feedback circuit generates the feedback signal, which is substantially equal to the output signal, from its input signal. In this fashion, the feedback isolation amplifier takes advantage of feedback while maintaining the required isolation between input and output.

In an amplifier employing feedback, the output signal is accurately proportional to the input signal despite fairly large variations in the values of circuit components. Thus a feedback isolation amplifier can be built from inexpensive, low-accuracy components and still achieve high-accuracy amplification similar to that of a non-feedback amplifier using more expensive components. Therefore, the practice of the invention achieves greater cost effectiveness in isolation amplifiers.

In one embodiment of the invention, a feedback isolation amplifier is employed to sense a DC input signal and produce an isolated DC output signal that is proportional to the input signal by an accurate amplification factor. In this embodiment, the input circuit is an amplitude modulator that generates an amplitude-modulated (AM) signal. The modulation of the AM signal is proportional to the amplitude difference between the input signal and the feedback signal. The AM signal is coupled via a toroid transformer to the output circuit and to the feedback circuit, both of which are simple AM demodulators. The output circuit and feedback circuit demodulate their input signals to generate the DC output signal and the DC feedback signal, respectively.

The principles of the invention may be applied to other isolation amplifier embodiments as well, where increased cost effectiveness can be exploited to either minimize the cost to achieve a desired accuracy, or to maximize the accuracy for a given cost.

BRIEF DESCRIPTION OF THE DRAWING

Embodiments of the invention will be described with reference to the accompanying drawings, in which.

DESCRIPTION OF THE PREFERRED EMBODIMENT

Figure 1:
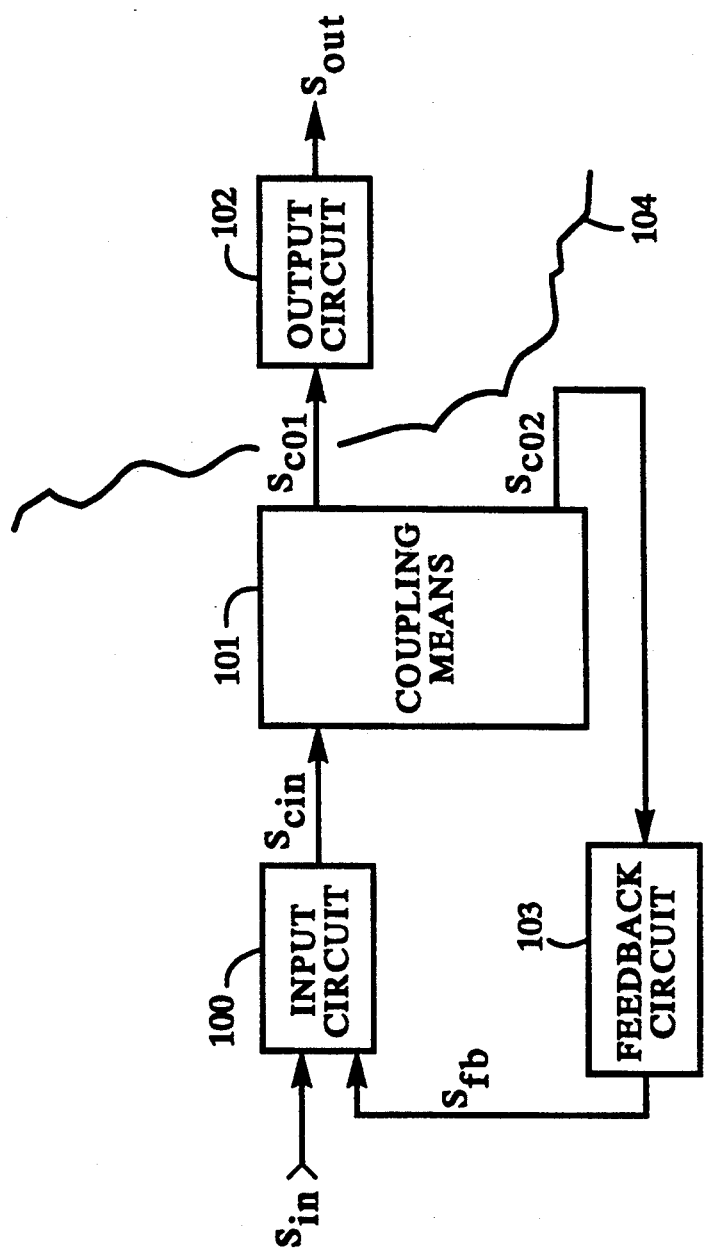
FIG. 1 is a functional block diagram of a feedback isolation amplifier embodying the invention.

FIG. 1 is a functional illustration of a feedback isolation amplifier having an input circuit 100, a coupling means 101, an output circuit 102, and a feedback circuit 103. The input circuit 100 receives an input signal $S_{in}$ and a feedback signal $S_{fb}$, and generates a difference signal $S_{cin}$. The input signal $S_{in}$ may be, for example, the output from a circuit which senses a DC battery voltage. The signal $S_{cin}$ is applied to the input of the coupling means 101, which in turn generates signals $S_{co1}$ and $S_{co2}$ at its outputs. The signal $S_{co2}$ is applied to the input of the feedback circuit 103, which generates the feedback signal $S_{fb}$. The signal $S_{co1}$ is applied to the input of the output circuit 102, which generates an output signal $S_{out}$. The output circuit 102 is electrically isolated from the input circuit 100 in FIG. 1 by an isolation barrier 104.

In operation, the input circuit 100 of FIG. 1 detects the difference in the amplitudes of the signals $S_{in}$ and $S_{fb}$; this difference is an error value $S_{err}$ (not shown in FIG. 1). The input circuit 100 applies a high-amplification function I to the error value $S_{err}$ in order to create the signal $S_{cin}$. As a result, $$S_{cin} = I\{S_{err}\}$$

$$S_{cin} = I\{S_{in} - S_{fb}\}$$

The large amplification of the input circuit 100 may be accomplished, for example, by a high-amplification differential amplifier; these are capable of amplification on the order of $10^5$. There are many functions I that can be used to create the signal $S_{cin}$. For example, I may be simple amplification by a factor A, in which case $S_{cin} = A(S_{in} - S_{fb})$. Or I may be a modulation function. Functionally, the signal $S_{cin}$ is of a form that is suitable for communicating the error value across the isolation barrier 104 to the output circuit 102.

The coupling means 101 couples the signal $S_{cin}$ to the output circuit 102 while maintaining electrical isolation between the input circuit 100 and the output circuit 102. The coupling means 101 also couples the signal $S_{cin}$ to the feedback circuit 103. The coupling means conveys the signal $S_{cin}$ to the output circuit 102 and to the feedback circuit 103 in substantially the same way, so that the signals $S_{co1}$ and $S_{co2}$ are as similar as possible. For example, if the signal $S_{cin}$ is an amplitude-modulated signal, then the coupling means 101 should have matched amplitude characteristics along both of its coupling paths. A transformer having 2 identical secondary windings is an example of a such a coupling means. Alternatively, if the signal $S_{cin}$ is a frequency-modulated signal, then the coupling means should have matched frequency-response characteristics along the two paths. This could be achieved by using optoisolators in the coupling means 101.

The output circuit 102 generates the signal $S_{out}$ from the signal $S_{co1}$, which is the copy of the signal $S_{cin}$ that it receives from the coupling means 101. The output circuit 102 performs the function O on the signal $S_{co1}$ to derive $S_{out}$ from the signal $S_{co1}$. Therefore $S_{out}$ is given by:

$$S_{out} = O\{S_{co1}\}$$
$$= O\{S_{cin}\}$$
$$= O\{I\{S_{err}\}\}$$
$$= O\{I\{S_{in} - S_{fb}\}\}$$
$$= G\{S_{in} - S_{fb}\}$$

where G is the overall amplification of the compound function $O\{I\{x\}\}$ performed by the combination of the input circuit 100 and the output circuit 102. Since the amplification G is very large, $S_{err}$ is very small compared with $S_{err}$. For example, if $S_{out}$ is 5 VDC and G is $10^5$, then $S_{err}$ is on the order of 50 microvolts. Therefore $S_{in}$ and $S_{fb}$ are substantially equal, because their difference is only 50 microvolts. Note that neither function O nor I must be highly accurate as long as the compound function $O\{I\{x\}\}$ has high amplification.

The feedback circuit 103 of FIG. 1 performs a function that has a well-defined relationship with the function O performed by the output circuit 102, so that the signal $S_{fb}$ has a well-defined relationship with the signal $S_{out}$. One way to achieve this is by making the feedback circuit 103 a duplicate of the output circuit 102. In that case, the feedback circuit 103 and the output circuit 102 both perform the function O, so that $S_{fb} = S_{out}$. For example, if the signal $S_{cin}$ is amplitude-modulated, the output circuit 102 and the feedback circuit 103 are simple AM demodulators. It is easy to construct matching AM demodulators in a known fashion using low-accuracy, inexpensive components.

The output circuit 102 and the feedback circuit 103 should drive similar loads, so that the output circuit 102 and the feedback circuit 103 operate as identically as possible. In practice, the output circuit 102 might drive a high-impedance buffer, such as an op-amp, so that the output circuit 102 has a predictable load under varying operating conditions. In such a case, the feedback circuit 103 should also drive a high-impedance load in the input circuit 100.

When the the feedback circuit 103 is a duplicate of the output circuit 102, then $S_{out} = S_{fb}$, as noted above. In that case:

$$S_{fb} = S_{out} = G(S_{in} - S_{fb})$$
$$= G(S_{in}) - G(S_{fb})$$
$$= G(S_{in}) - G(S_{out})$$

So that $S_{out} = [G/(G+1)](S_{in})$.

If the amplification G is much greater than 1, as discussed above, then the signal $S_{out}$ is substantially equal to the signal $S_{in}$ regardless of the absolute value of G and despite inaccuracies in I and O, as mentioned above. Therefore the circuit of FIG. 1 functions as a feedback isolation amplifier whose output $S_{out}$ accurately represents the value of its input $S_{in}$.

Figure 2:
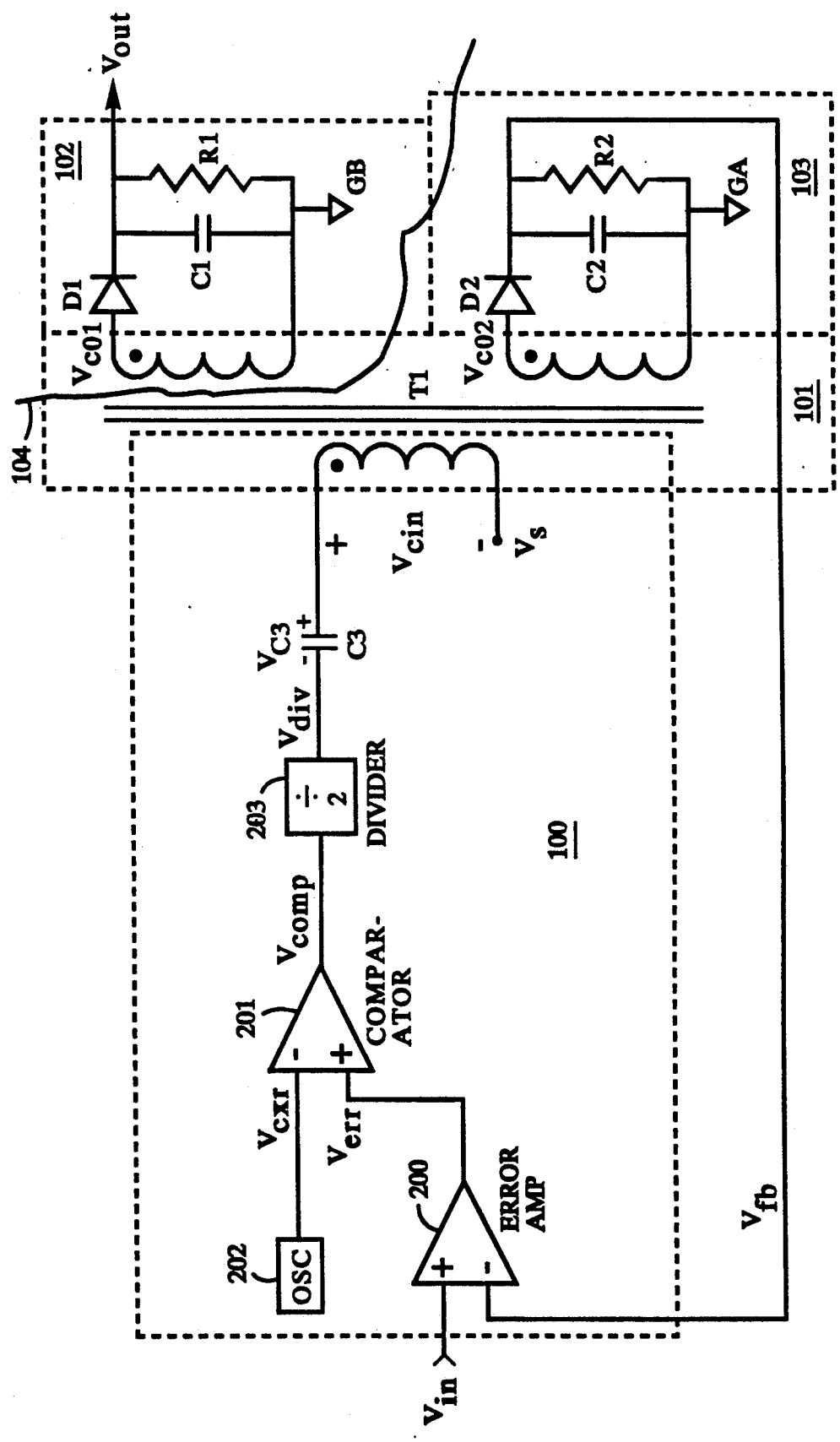
FIG. 2 is a circuit diagram of a voltage feedback isolation amplifier employing amplitude modulation.

FIG. 2 illustrates a voltage feedback isolation amplifier which is especially suited to sensing a DC voltage level at its input and providing an identical but isolated DC output. Such an amplifier may be employed, for example, in monitoring a battery voltage in an electric power supply system. The components within the broken line boxes in FIG. 2 correspond to the functional blocks shown in FIG. 1. The signals in FIG. 2 are denoted as voltage signals $V_{xx}$ instead of general signals $S_{xx}$ as in FIG. 1.

The topology of the circuit shown in FIG. 2 will now be described. In FIG. 2, an input voltage $V_{in}$ is applied to the non-inverting input terminal of an error amplifier 200, and a feedback voltage $V_{fb}$ is applied to the inverting input terminal of the error amplifier 200. The input voltage $V_{in}$ may be the output, for example, from a circuit which senses a DC battery voltage. The error amplifier 200 generates an error voltage $V_{err}$ which is applied to the non-inverting input terminal of a comparator 201. The inverting input terminal of the comparator 201 receives a carrier voltage signal $V_{cxr}$ which is generated by an oscillator 202 or other suitable means.

The comparator 201 generates a pulse-width modulated voltage signal $V_{comp}$, which is applied to the input terminal of a divider 203. A voltage signal $V_{div}$, which is a pulse-width modulated signal having a 50% maximum duty cycle, appears on the output of the divider 203. The signal $V_{div}$ is AC coupled by a capacitor C3 to the "dotted" end of the primary winding of a transformer T1; the voltage across the primary of T1 is $V_{cin}$. The "non-dotted" end of the primary winding of transformer T1 is connected to a first supply voltage $V_s$ for reasons to be described. The supply voltage $V_s$ is common to the elements in the input circuit 100 and the feedback circuit 103. A suitable value for $V_s$ is +15 VDC.

The transformer T1 has two matched secondary windings. The first secondary winding drives an AM demodulator output circuit 102. The voltage signal $V_{col}$ appears on the positive output terminal of the first secondary winding, which is connected to the positive terminal of a diode D1. The negative output terminal of the first secondary winding is connected to a ground GB, which is common to the elements in the output circuit 102 and is isolated from grounds in the input circuit 100 and feedback circuit 103. The negative terminal of the diode D1 is connected to one side of a parallel filter network consisting of a capacitor C1 and a resistor R1. The other side of the capacitor C1 and the resistor R1 are connected to ground GB. The DC output voltage $V_{out}$ appears at the junction of D1, C1, and R1, as shown in FIG. 2.

The second secondary winding of transformer T1 drives a feedback circuit 103, which is an AM demodulator constructed identically to the AM demodulator output circuit 102. The voltage signal $V_{co2}$ appears on the positive output terminal of the second secondary winding, which is connected to the positive terminal of a diode D2. The negative output terminal of the second secondary winding is connected to a ground GA. The negative terminal of the diode D2 is connected to one side of a parallel filter network consisting of a capacitor C2 and a resistor R2. The other side of the capacitor C2 and the resistor R2 are connected to ground GA. The feedback voltage signal $V_{fb}$, which is fed back to the negative input terminal of the error amplifier 200, appears at the junction of D2, C2, and R2.

The operation of the voltage feedback isolation amplifier of FIG. 2 will now be described with reference to the signal waveforms shown in FIG. 3. The output from oscillator 202 is a sawtooth voltage signal $V_{cxr}$ sweeping from zero volts to $V_s$ during a period T, which is approximately 5 usec. The output from the error amplifier 200, $V_{err}$, is proportional to the difference between the signals $V_{in}$ and $V_{fb}$ by a large amplification factor A. The output of the comparator 201, $V_{comp}$, is high when the carrier voltage $V_{cxr}$ is less than the error voltage $V_{err}$, and is low when the carrier voltage $V_{cxr}$ is greater than the error voltage $V_{err}$. The combination of the error amplifier 200, the comparator 201, and the oscillator 202 therefore constitutes a pulse-width modulator, and the voltage signal $V_{comp}$ is a pulse stream whose duty cycle $D_{comp}$ is nominally given by:

$$D_{comp} = A(V_{in} - V_{fb}) / V_s$$

The divider 203 removes every other pulse from the voltage $V_{comp}$, so that the duty cycle $D_{div}$ of the voltage $V_{div}$ is half the duty cycle $D_{comp}$ of the voltage $V_{comp}$. Therefore the maximum value of $D_{div}$ is slightly less than 50%. Also note in FIG. 3 that the voltage $V_{div}$ is inverted from the voltage $V_{comp}$. The presence of the divider 203 is not essential in a voltage feedback isolation amplifier of the type shown in FIG. 2; it is shown because it is part of a commercial integrated circuit known as a 3527, available from Unitrode, Inc, used in this embodiment. The 3527 is a pulse width modulator that includes the following elements: the error amplifier 200, comparator 201, oscillator 202, and divider 203.

Figure 3:
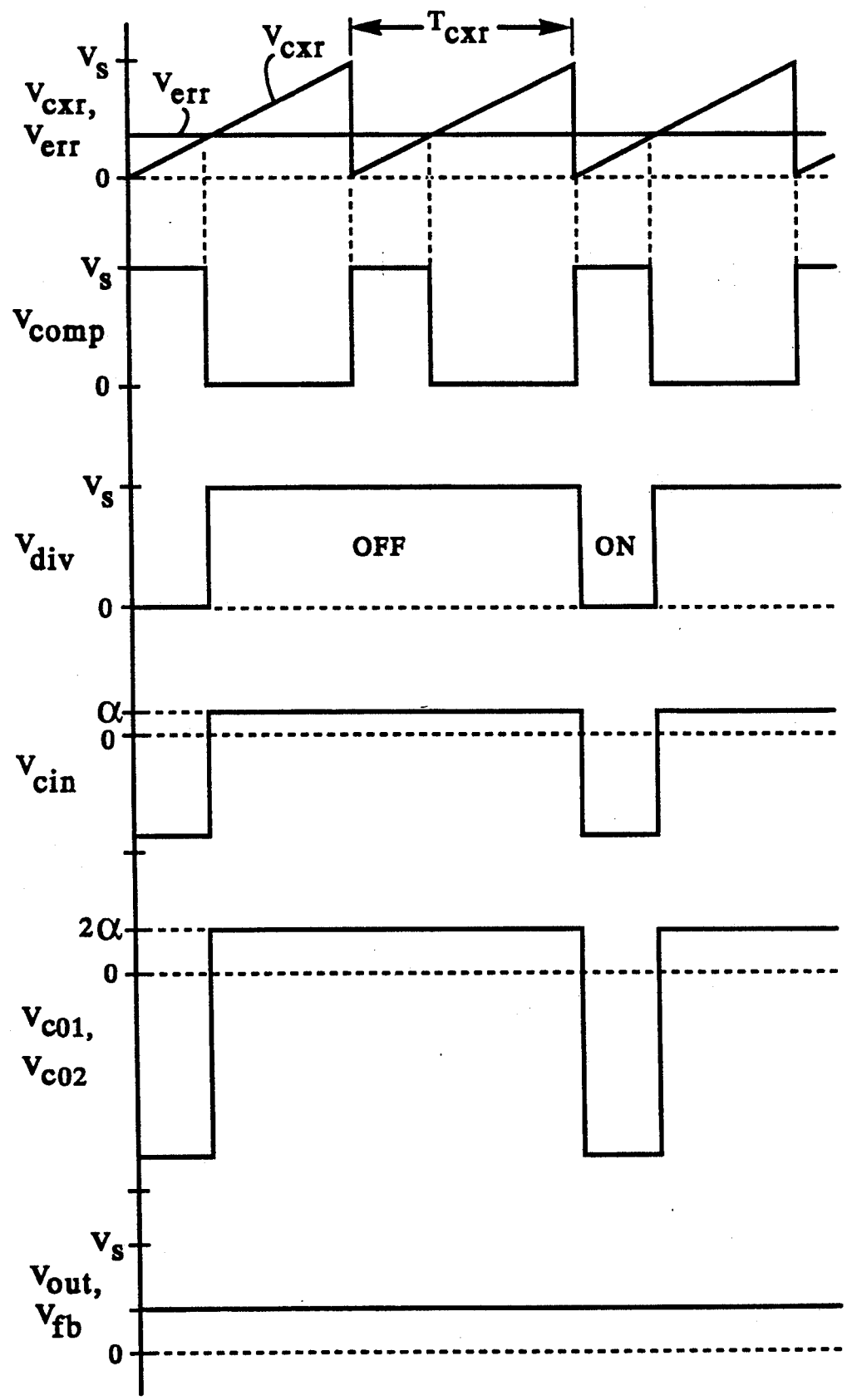
FIG. 3 illustrates several signal waveforms in the circuit of FIG. 2.

$V_{div}$ is a pulse stream as shown in FIG. 3. The average DC value of the voltage $V_{div}$ is a function of its duty cycle $D_{div}$:

Avg. value of $V_{div} =$ $$(D_{div})(0 \text{ v}) + (1 - D_{div})(V_s) = (1 - D_{div})(V_s)$$

For example, if $V_s$ is 15 volts and the duty cycle $D_{div}$ is 10%, then the average DC value of $V_{div}$ is $(1-0.1)(15) = 13.5$ volts.

Thus for a non-zero duty cycle, the average DC value of the voltage $V_{div}$ is less than $V_s$, and it varies with the duty cycle $D_{div}$. This average value appears on one side of the capacitor C3. On the other side of the capacitor C3, the average DC value is equal to $V_s$, because the negative terminal of the primary winding of T1 is tied to $V_s$. As a result, the voltage $V_{c3}$ across the capacitor C3 has an approximately constant DC value $\alpha$ given by:

$$\begin{aligned}\alpha &= V_s - V_{div} \\ &= V_s - (1 - D_{div})(V_s) \\ &= (D_{div})(V_s)\end{aligned}$$

When $V_{div}$ is OFF, as shown in FIG. 3, the voltage $\alpha$ is impressed across the primary winding of the transformer T1 (this is shown as the voltage $V_{cin}$ in FIGS. 2 and 3). The value of C3 should be large enough so that its voltage $V_{c3}$ does not change significantly during the OFF time of the voltage $V_{div}$; in this embodiment, the value of C3 is 0.47 uf.

As shown above, $\alpha$ is proportional to the duty cycle $D_{div}$ of the voltage $V_{div}$, which in turn is proportional to the error voltage $V_{err}$. Therefore:

$$\begin{aligned}V_{cin} = \alpha &= (D_{div})(V_s) \\ &= (\tfrac{1}{2})(D_{comp})(V_s) \\ &= (\tfrac{1}{2})A(V_{in} - V_{fb})\end{aligned}$$

Thus the voltage $V_{cin}$ produced by the modulator 100 has a positive amplitude $\alpha$ that varies according to the difference between the signals $V_{in}$ and $V_{fb}$.

The voltage $V_{cin}$ is coupled to the output circuit 102 and the feedback circuit 103 by the transformer T1, which has closely matched secondary windings with 2:1 turns ratios. A toroid transformer is preferred, because of its low flux leakage. The signals $V_{co1}$ and $V_{co2}$ appearing on the secondary windings of T1 are shown in FIG. 3. The amplitude of the maximum positive excursion of the signals $V_{co1}$ and $V_{co2}$ is 2 $\alpha$.

The signals $V_{co1}$ and $V_{co2}$ are peak-detected by the demodulators 102 and 103, which results in the DC output signals $V_{out}$ and $V_{fb}$. Since the performance of peak-detector modulators is fairly insensitive to circuit component values, demodulators 102 and 103 provide substantially equal output signals without requiring closely matched component values. In this embodiment, capacitors C1 and C2 have the value 0.1 uf, and the resistors R1 and R2 have the value 10K ohms.

The feedback voltage $V_{fb}$ serves as a non-isolated copy of the output voltage $V_{out}$ that is employed to control the feedback loop shown in FIG. 2. The values of the signals $V_{out}$ and $V_{fb}$ are given by:

$$\begin{aligned}V_{fb} = V_{out} &= 2\alpha \\ &= 2(\tfrac{1}{2})A(V_{in} - V_{fb}) \\ &= A(V_{in} - V_{fb}) \\ &= A(V_{in} - V_{out}) \\ V_{out} &= [A/(A + 1)](V_{in})\end{aligned}$$

Therefore, the circuit of FIG. 2 functions as a voltage feedback isolation amplifier, and is an implementation of the general scheme shown in FIG. 1. While the voltage feedback isolation amplifier of FIG. 2 is particularly suited to DC voltage applications, the invention may find use in many other applications which require accurate amplification of signals across an isolation barrier.

Figure 4:
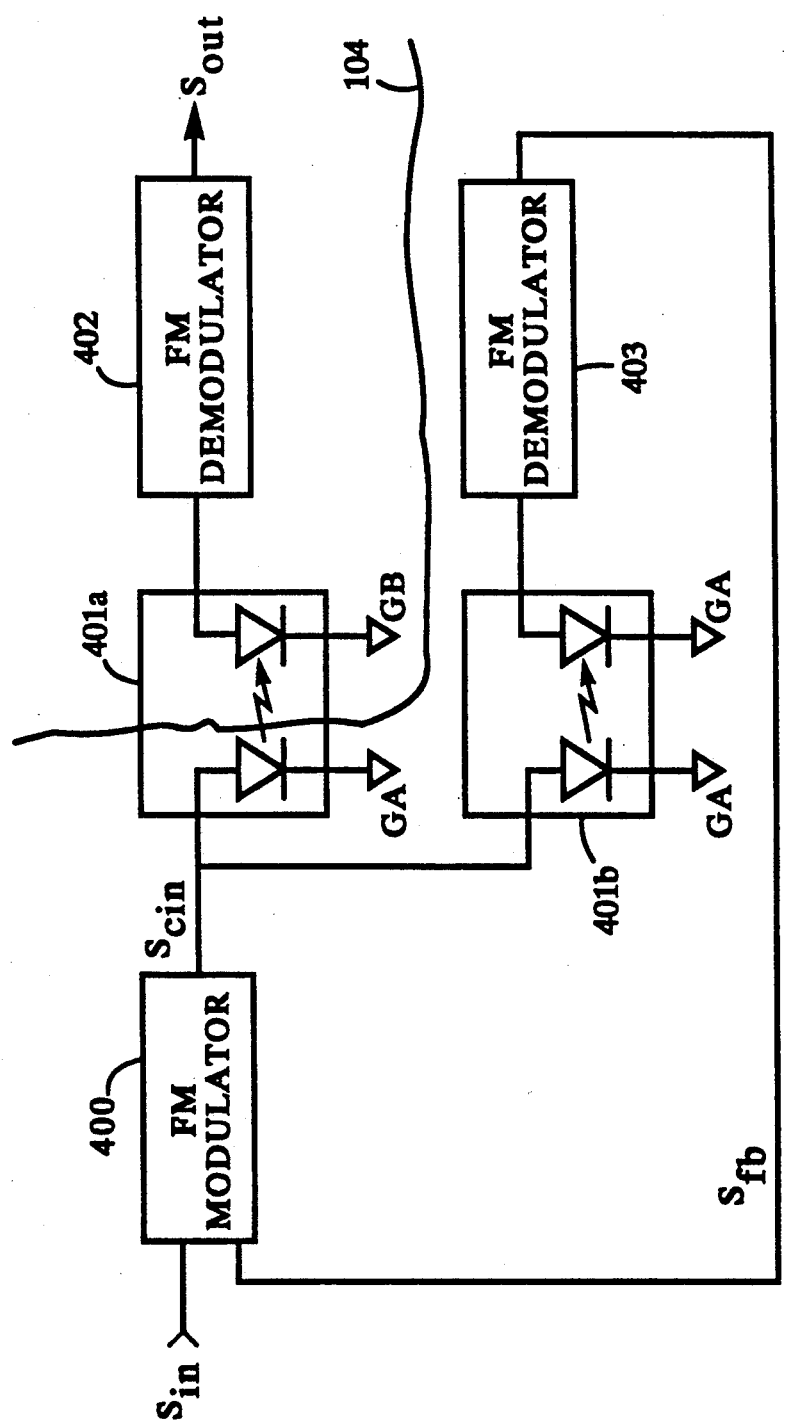
FIG. 4 is a block diagram of a feedback isolation amplifier employing frequency modulation.

FIG. 4 shows a block diagram of an alternative embodiment of the invention employing frequency modulation rather than amplitude modulation. An input signal $S_{in}$ and a feedback signal $S_{fb}$ are applied to an FM modulator 400. The output of the modulator 400 drives a pair of optoisolators 401a and 401b, which couple the FM output signal $S_{cin}$ to FM demodulators 402 and 403. The output of the demodulator 402 is the output signal $S_{out}$. The output of the demodulator 403 is the feedback signal $S_{fb}$, which is fed back to the modulator 400.

Note that the receiver portion of optoisolator 401a is referenced to ground GB, while the transmitter portion is referenced to ground GA. This configuration maintains electrical isolation between the modulator 400 and the demodulator 402.

The isolation amplifier of FIG. 4 operates according to the same principles discussed with reference to FIG. 1. There are several known techniques for making the modulator 400 and the demodulators 402 and 403. The o-optoisolators 401a and 401b operate to couple the FM signal $S_{cin}$ in the form of light waves. The use of optoisolators is advantageous in an FM system because they are readily available and inexpensive. Furthermore, the amplitude characteristics of the optoisolators 401a and 401b need not match, because the FM demodulators 402 and 403 are fairly insensitive to amplitude distortion of the FM signal $S_{cin}$.

Besides the embodiments shown in FIGS. 2 and 4, there are other implementations of the functional blocks shown in FIG. 1 that are possible within the scope of the invention, which is set forth in the following claims.

What is claimed is:

1. A feedback isolation amplifier, comprising:
    an input circuit to produce at an output a difference signal representing the amplitude difference between an input signal received at a first input of said input circuit and a feedback signal received at a second input of said input circuit;
    an output circuit electrically isolated from said input circuit and having an electrical input;
    a feedback circuit substantially functionally identical to said output circuit and having an electrical input and an output, said output being connected to said second input of said input circuit; and
    means for coupling said difference signal substantially identically to said input of said output circuit and to said input of said feedback circuit, said coupling means maintaining electrical isolation between said input circuit and said output circuit.

2. A feedback isolation amplifier according to claim 1, wherein said coupling means comprises an isolation transformer having a primary winding connected to said output of said input circuit, one secondary winding connected to said input of said output circuit, and another secondary winding connected to said input of said feedback circuit.

3. A feedback isolation amplifier according to claim 1, wherein said input circuit comprises a differential amplifier.

4. A feedback isolation amplifier according to claim 1, wherein:
    said input circuit comprises a modulator to produce said difference signal having modulation proportional to the difference between the amplitude of said input signal and the amplitude of said feedback signal;
    said output circuit comprises a first demodulator to demodulate said difference signal; and
    said feedback circuit comprises a second demodulator to demodulate said difference signal.

5. A feedback isolation amplifier according to claim 4, wherein:
    said modulator is an amplitude modulator; and
    said first and second demodulators are amplitude demodulators.

6. A feedback isolation amplifier according to claim 4, wherein:
    said modulator is a frequency modulator; and
    said first and second demodulators are frequency demodulators.

7. A feedback isolation amplifier according to claim 6, wherein said coupling means comprises:
    a first optoisolator having an input and an output, said input connected to said output of said frequency modulator, and said output connected to said input of said first demodulator; and
    a second optoisolator having an input and an output, said input connected to said output of said frequency modulator, and said output connected to said input of said second demodulator.

8. A voltage feedback isolation amplifier, comprising:
    a pulse-width modulator to produce at an output a pulse-width modulated signal having a pulse width proportional to the difference between an input signal received on a first input of said pulse-width modulator and a feedback signal received on a second input of said pulse-width modulator;
    a first peak-detector amplitude demodulator electrically isolated from said pulse-width modulator and having an input;
    a second peak-detector amplitude demodulator having an input and an output, said output connected to said second input of said pulse-width modulator;
    an isolation transformer having a primary winding, a first secondary winding connected to said input of said first amplitude demodulator, and a second secondary winding connected to said input of said second amplitude demodulator; and
    a capacitor coupling said output of said pulse-width modulator to said primary winding of said isolation transformer.

9. A voltage isolation amplifier according to claim 8, wherein said isolation transformer is a toroid transformer.

10. A voltage isolation amplifier according to claim 8, wherein said pulse-width modulator comprises:
    an error amplifier having a first input to receive said input signal and a second input to receive said feedback signal, to produce at an output an error signal proportional to the difference between said input signal and said feedback signal;
    an oscillator to produce at an output a sawtooth signal; and
    a comparator having a first input connected to said output of said error amplifier, and a second input connected to said output of said oscillator.

11. A voltage isolation amplifier according to claim 8, wherein each of said first and second peak-detector amplitude demodulators comprises:
    a parallel resistor-capacitor filter network; and
    a rectifying diode coupling said input of the corresponding one of said first and second peak-detector amplitude demodulators to said filter network.

* * * * *